United States Patent
Dujardin et al.

(12) 
(10) Patent No.: US 6,308,191 B1
(45) Date of Patent: Oct. 23, 2001

(54) PROGRAMMABLE PROCESSOR CIRCUIT WITH A RECONFIGURABLE MEMORY FOR REALIZING A DIGITAL FILTER

(75) Inventors: Eric Dujardin; Olivier Gay-Bellile, both of Paris (FR)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/264,912

(22) Filed: Mar. 9, 1999

(30) Foreign Application Priority Data

Mar. 10, 1998 (FR) .................................................. 9802910

(51) Int. Cl.[7] .................................................. G06F 17/10
(52) U.S. Cl. .................................................. 708/319
(58) Field of Search .................................. 708/319, 303, 708/300

(56) References Cited

U.S. PATENT DOCUMENTS

| | | | |
|---|---|---|---|
| 5,513,223 | * | 4/1996 | Shoji ..................................... 708/319 |
| 5,793,656 | * | 8/1998 | Richmond et al. .................. 708/300 |
| 5,904,731 | * | 5/1999 | Matsui ................................. 708/319 |
| 6,154,761 | * | 11/2000 | Kondo et al. ....................... 708/300 |
| 6,209,013 | * | 3/2001 | Gonikberg ........................... 708/319 |

FOREIGN PATENT DOCUMENTS 0454050   10/1991   (EP) ............................... G06F/7/544

* cited by examiner

*Primary Examiner*—David H. Malzahn

(57) ABSTRACT

A memory system is disclosed. The memory system provides for input data (datain_B and datain_F) and for taps (w_in) and is partitioned into various segments. The memory system includes means for recombining the segments in order to be adapted to different filters. In one embodiment, with the total dimension of the memory being 2L, the memory system includes six partitions having respective dimensions 2L/5, 4L/15, L/3, L/5, 2L/15, 2L/3, between which the data and taps are distributed by means of multiplexers.

4 Claims, 3 Drawing Sheets

Figure 1:
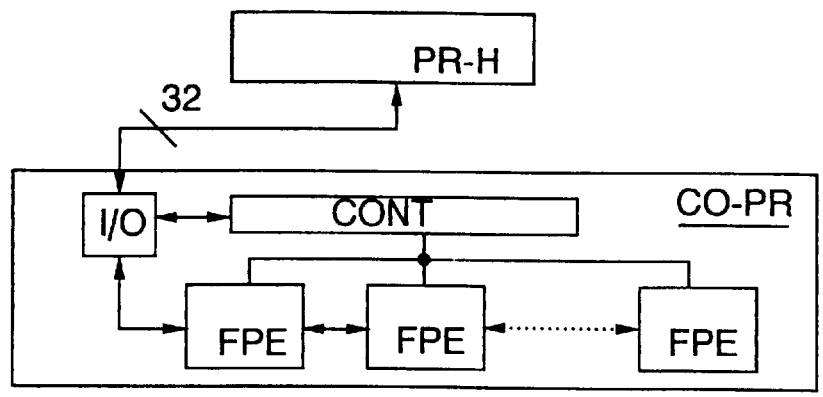

|  | T | B D | F D |
|---|---|---|---|
| R / C  FIR | 2 L x 1/2 | 0 | 2 L x 1/2 |
| R / C Symetr | 2 L x 1/3 | 2 L x 1/3 | 2 L x 1/3 |
| CD / RT  FIR | 2 L x 1/3 | 0 | 2 L x 2/3 |
| CD / RT Symetr | 2 L x 1/5 | 2 L x 2/5 | 2 L x 2/5 |

PROGRAMMABLE PROCESSOR CIRCUIT WITH A RECONFIGURABLE MEMORY FOR REALIZING A DIGITAL FILTER

The present invention relates to a programmable co-processor circuit intended to be associated to a main processor for forming a digital filter, the circuit including at least a filter processor element having memory capacity for input data and for coefficients called "taps", at least an adder and a multiplier of which one input is connected to a result output of the adder and another input is connected to a read output of the taps memory.

Such a circuit is notably used in applications where various filters are necessary, such as various multimedia applications, for example, for reducing intersymbol interference, for changing the data rate or for reducing the noise added by a communication channel.

A digital filter in essence includes a sequence of elements between which signals are tapped which are processed, notably multiplied by a tap and/or added together and are then re-injected elsewhere. For realizing digital filters, three paths are known:—utilization of a processor of the DSP type with specialized algorithms for forming a filter; if this path offers great flexibility, it has, however, limited filter performance, notably as regards speed,—utilization of specialized circuits directly forming filters; this permits great performance, but leads to a development of many different circuits,—utilization of specialized but programmable circuits; this provides a good compromise between the high performance of specialized circuits and the good flexibility of a DSP; among the programmable specialized circuits are distinguished processor programmable filters, which means that they are in essence formed by a DSP processor reduced to the minimum required by the process implemented in a filter. This is the most interesting solution.

A programmable specialized circuit includes memories for storing programmable taps. It is generally configured for realizing a particular type of filter: symmetrical, half-band, interpolation, decimation, adaptive, complex filter. An integrated circuit for a processor programmable filter is known from European patent application EP 0 454 050. The integrated circuit according to this document includes a multiplier and an adder, a memory for storing data and a program memory for storing sets of instruction codes and taps values, and a memory for instructions read from the program memory, which enables to execute an instruction while continuously reading the taps values. The integrated circuit includes a separate memory for the data and one for the taps, so as not to have to read the data at a time different from the time at which the taps are read.

It is an object of the invention to provide a programmable circuit that enables the multiplexing of different types of filters by utilizing the memory in optimum fashion, even when they have different requirements as regards memory size for storing the data and the taps.

For this purpose, the input data memory and the taps memory are placed in a single memory that is partitioned into various segments possessing a limited number of inputs/outputs, and means are provided for variably combining the segments in order to adapt the memory in optimum fashion to different filters.

The basic idea of the invention is thus to divide the memory between the data and the taps by using various memories, without increasing the size of the memory, which enables to use, for example, only an input port and two output ports, as is shown by an embodiment described below, so as to have the maximum efficiency at lower cost than that of a large memory with three input ports and five output ports. Actually, the surface of a memory much depends on the number of ports.

These and other aspects of the invention are apparent from and will be elucidated with reference to the embodiments described hereinafter, which constitute a non-limitative example.

Figure 2:
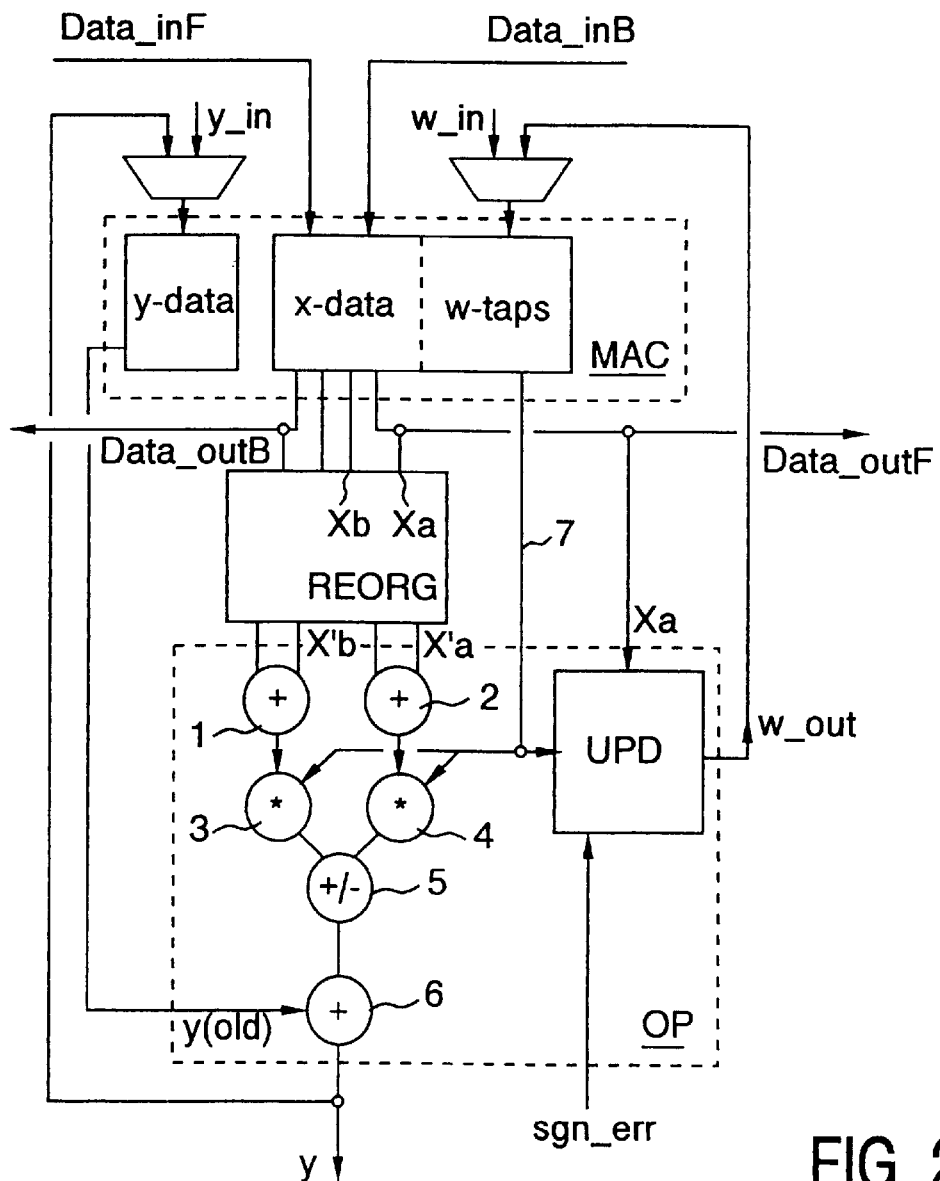
Figures 3, 4:
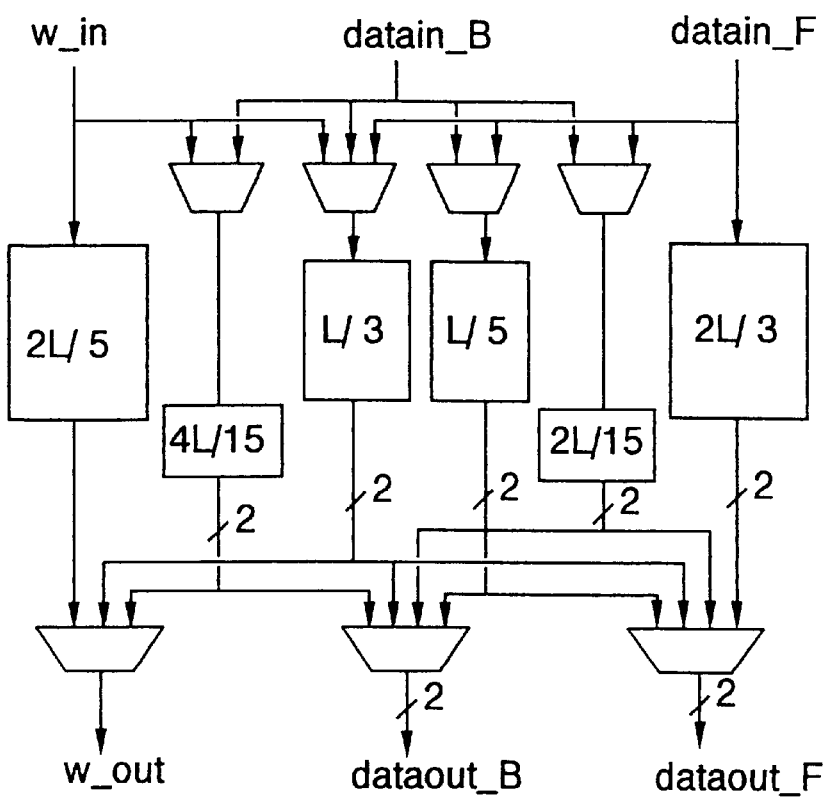
Figure 5:
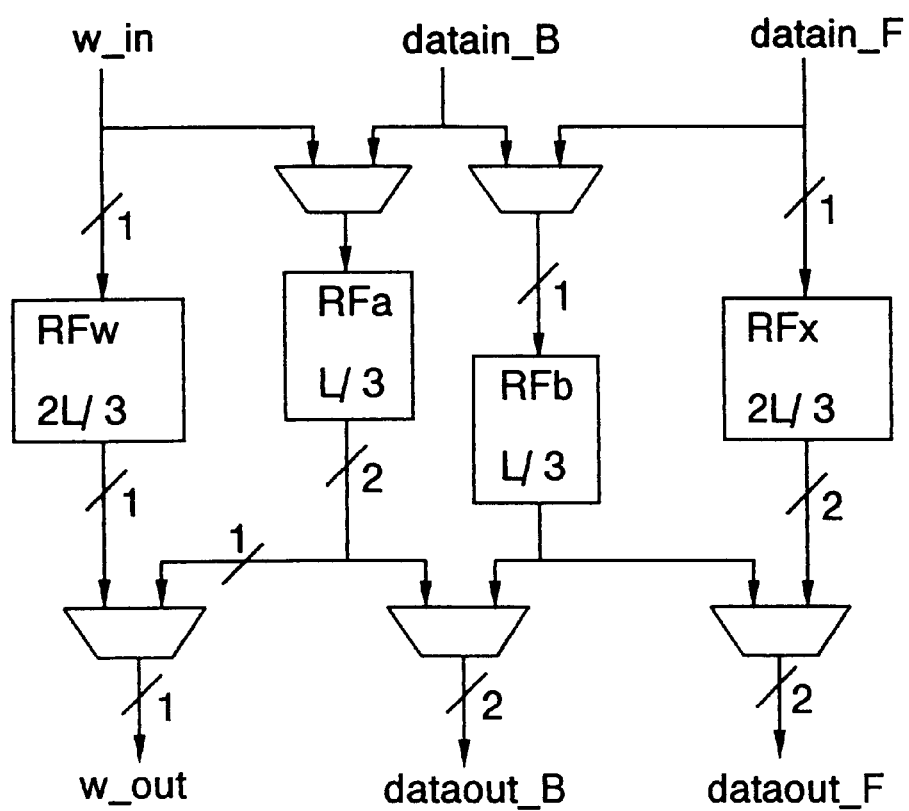

In the drawings:

FIG. 1 diagrammatically shows a calculation system of filters including various filter processor elements, FIG. 2 is a more detailed diagram of a filter processor element, FIG. 3 is a Table of required memory sizes, for various types of data, various taps and various types of filters, FIGS. 4 and 5 illustrate each an organization variant of the memories in a filter processing element.

The circuit CO-PR of FIG. 1 is a co-processor associated with a host processor PR-H, and it communicates with the host processor via a 32-bit bus, even when the digital filter does not need as many bits in parallel. It includes an I/O block, which synchronizes the communications between the host processor and the co-processor, and a control module CONT that writes the characteristics of the filter to be realized, and which controls filter processing elements FPE. Various filter processing elements FPE are provided for producing the necessary calculation power, their number will be called nc.

The filter processor element of FIG. 2 is formed by two main parts: an operating part OP and a memory part MAC. The operating part contains multipliers and adders required for calculating the filters and logic circuits used for updating the taps of the adaptive filters. The memory part contains a w-tap memory for storing all the taps used by the various multiplexed filters, an x-data memory for storing all the input data used by the filters, and a y-data memory for storing the intermediate results of various filters. The y-data memories are particularly intended for the calculation with multiplexing. The input w_in is used for initializing the w_tap memory.

Data are transmitted by two unidirectional lines between the filter processor elements: a "forward" line Data_inF/Data_outF and a "backward" line Data_inB/Data_outB. The forward line transmits data from the left to the right. The backward line transmits data from the right to the left; this line is only used in the case of symmetrical filters. The results are transmitted from the right to the left through the ports y_ in and y.

Because of the fact that there are various formats possible for the data, that a decimation may be realized, and that the data may be real or complex, a data reorganization block REORG is provided having means for receiving input data from the input data memory x-data, for reorganizing them and applying them to the first and second adder in order to feed the operating part with adequate data. Data Xa and Xb coming from the x-data memory, corresponding to those transmitted by the forward line, are transformed into X'a and X'b by this reorganization block.

The operating part OP includes two adders 1 and 2, each of them having its output connected to an input of a multiplier 3, 4 respectively, whose other input receives a tap value from the w_tap memory via a connection 7, and the outputs of the first and the second multiplier are connected each to an input of an adder/subtracter 5 whose output is connected to an input of a final adder 6, the other input of this adder receiving the result y(old) obtained in the preceding cycle from the intermediate result memories, and its output delivering the calculation result "y" which corresponds to the current cycle. These two adders 1, 2, two multipliers 3, 4 realize the accumulations and multiplications required for the calculation of intermediate results. Each multiplier 3, 4 of 32 precision bits may be used as two 16-bit multipliers, in order to be able to process a 16-bit complex multiplication every cycle, and each adder 1, 2 includes two 16-bit adders. 8-bit words can be used; each 16-bit operator may be regarded as two 8-bit operators. Thus, a filter processing element may simultaneously process up to twenty four 8-bit operations. Each operator may be regarded as four 8-bit operators or as two 16-bit parallel operators. The two adders 1, 2 are used when a filter is symmetrical; they are short-circuited in other cases. The adder/subtracter 5 is used as a subtracter when this is required by a complex multiplication, and as an adder in the other cases.

An updating block UPD is used for adapting the taps in the case of an adaptive filter. It receives a data "sgn_err" which is calculated by the host processor in the case of an adaptive filter, the sign sgn of a data Xa and a tap value w_in coming from the w_tap memory via the connection 7. It delivers a tap value w_out to be stored in the tap memory.

The various types of filters calculated by programmable processors have different requirements in terms of memory size for storing the data and the taps, so that they cannot easily use their memory in efficient manner for all types of filters. By supposing that the memories have a total dimension 2 L, the needs for memory size for respectively the forward data, the backward data and the taps are indicated by the Table of FIG. 3. The indications FD, BD, T over the column designate the forward data, backward data and the taps respectively; at the beginning of the row the indication "R/C FIR" designates a FIR filter with data and taps of the same type (complex or real); the indication "R/C symetr" designates a symmetrical filter with data and taps of the same type (real or complex); the indication "CD/RT FIR" designates a FIR filter with complex data and real taps and the indication "CD/RT symetr" designates a symmetrical filter with complex data and real taps. The backward data are only used in the case of symmetrical filters. The usual filters require the same memory size for the data and for the taps, whereas the symmetrical filters use two data for one tap. Furthermore, a complex data requires twice more memory capacity than a real data. Thus, for the filters featured in the Table of FIG. 3, the memory may be considered to be either two memories of identical size in the case <<R_C FIR>>, three memories of identical ize in the case <<R/C symetr>>, or also three memories of which two are twice as large as the third one in the case <<CD/RT symetr>>and finally two memories of which one is twice as large as the other one in the case of the filters <<CD/RT FIR>>. Being given that 30 is the smallest common multiple between 2, 3 and 5; one will need 30 memories of size L/15 for configuring the data memory and tap memory in optimum fashion.

A complete solution would thus imply 30 memories. In fact, only six memories are used because all the memories that always store the same type of data have always the same behavior and are combined. These six memories have different dimensions. This is illustrated by FIG. 4. The number of ports and the number of parts depend on the types of supported filters and on the number of multipliers in the operating part.

The following algorithm is used for combining the memories:

step 1: formation of a set of memory sections called segment, while considering the non-zero smallest value of all the values of the Table of FIG. 3. This value corresponds to the size of the segment.

step 2: for each type of filter, determining whether this segment will contain forward data, backward data or taps, subtracting the value found in step 1 from the smallest non-zero value of each column, repeating the steps 1 and 2 with the newly created Table, until all the values are zero.

In step 2, the input branches of the multiplexers are obtained. Thus for each type of filter, each memory is used by a single type of data or taps; all the memories that contain the same type of data or taps may be virtually concatenated to obtain a single virtual memory for each type of data and taps. The results produced by this algorithm are stored.

The generation of the addresses for the memories is made as if one had a memory for the forward data, one for the backward data and one for the taps. The dimension of the memory for the backward data is zero if the filter is not symmetrical. When using these absolute values, relative addresses may be generated and the memories are selected by performing subtractions and comparisons.

Nevertheless, at the cost of a reduction of the efficiency of the memory partitioning, the embodiment may be simpler. This is illustrated by FIG. 5. Certain of the six memories of size L/3 of FIG. 4 are always used in the same fashion; they are combined here and only four memories are used. Two of these four memories (RFw and RFx) contain 2L/3 words, and the two others (RFa and RFb) contain L/3 words. In the case of adaptive or decimation finite impulse response filters, the taps are placed in Rfw and Rfa, and the data in Rfx and Rfb. In the case of symmetrical filters, or complex data filters with real taps, the taps are placed in Rfw and the data in Rfx, Rfa and Rfb. Thus, the symmetrical filters with a number of 4L/3 data may also be realized by utilizing the whole capacity of the memories. Such a partitioning is not optimum, however, in the case of "CD/RT symetr". It is clear that other partitions may be imagined for other types of filters.

What is claimed is:

1. A programmable co-processor circuit associated with a main processor for forming a digital filter, the circuit comprising:

at least a filter processor element including a memory having a memory capacity for input data and for coefficients, called "taps";

at least an adder and a multiplier of which one input is connected to a result output of the adder and another input is connected to a read output of the memory for the taps, wherein the memory for the input data and the memory for the taps are placed in a single memory that is partitioned into a plurality of segments; and means for variably combining the plurality of segments in order to adapt the memory to different filters.

2. A programmable co-processor circuit as claimed in claim 1, characterized in that, with the total dimension of the memory of a filter processor element being 2L, the memory includes six sub-memories having respective dimensions 2L/5, 4L/15, L/3, L/5, 2L/15, 2L/3.

3. A programmable co-processor circuit as claimed in claim 1, characterized in that, with the total dimension of the memory of a filter processor element being 2L, the memory includes four sub-memories having respective dimensions of 2L/3, L/3, L/3, 2L/3.

4. A programmable co-processor circuit as claimed in claim 1, further comprising means for determining and storing high and low limits of the plurality of segments of the memory for the input data and taps.

* * * * *